United States Patent [19]

Kadota

[11] Patent Number: 4,823,313
[45] Date of Patent: Apr. 18, 1989

[54] MEMORY DEVICE WITH COMPARISON FUNCTION

[75] Inventor: Hiroshi Kadota, Toyonaka, Japan

[73] Assignee: Matsushita Electric Industrial Co., Ltd., Osaka, Japan

[21] Appl. No.: 930,364

[22] Filed: Nov. 12, 1986

[30] Foreign Application Priority Data

Nov. 19, 1985 [JP] Japan .................................. 60-258938

[51] Int. Cl.$^4$ .............................................. G11C 15/00
[52] U.S. Cl. ...................................... 365/49; 365/189; 365/45
[58] Field of Search ...................... 365/49, 45, 73, 189; 364/200 MS File, 900 MS File

[56] References Cited

U.S. PATENT DOCUMENTS

| 3,533,085 | 10/1970 | Murphy ................................. 365/49 |
| 4,523,301 | 6/1985 | Kadota et al. ....................... 365/49 |
| 4,656,626 | 4/1987 | Yudichak et al. .................... 365/49 |

OTHER PUBLICATIONS

Kautz, "Cellular Logic in Memory Arrays", IEEE Trasactions on Computers, vol. C-18, No. 8, Aug. 1969, pp. 719-727.

Primary Examiner—Stuart N. Hecker
Assistant Examiner—Glenn A. Gossage
Attorney, Agent, or Firm—Wenderoth, Lind & Ponack

[57] ABSTRACT

A memory device having a comparison function includes a plurality of unit cells. Each unit cell is composed of a memory cell, and first and second switching circuits, and a sense line. The first switching circuit is used for comparing input data D and stored data M, and is disposed between the sense line and ground. The second switching circuit is used for comparing input data D and stored data M, and is disposed serially in the sense line. When the stored data is larger than the input data, the output of the sense line becomes a "1" but when the stored data is smaller than the input data, the output of the sense line becomes "0". The memory device can then conduct a magnitude comparison between the stored data and the input data.

13 Claims, 3 Drawing Sheets

MEMORY DEVICE WITH COMPARISON FUNCTION

BACKGROUND OF THE INVENTION

This invention relates to a memory device with a comparison function, and more particularly to a hardware element for comparing the magnitude of binary numbers at a high speed and which can be used for, for example, high-speed-sorting processing among various data processings.

Sorting is a processing in which a plurality of data are sorted or arranged in order of magnitude. This processing has been carried out by use of software techniques. That is, (1) two pieces of data are compared to determine which is greater; (2) based upon the result of the comparison, the pieces of data are sorted in order of magnitude. Several kinds of algorithms are proposed for such a purpose.

However, in any algorithms, when the number of pieces of data becomes large, a very long time is required for processing such data. Therefore, it actually becomes impossible to frequently conduct the sorting. Therefore, when high-speed-sorting is required, exclusive-use-hardware, i.e., a "Sort Engine" is designed to realize the algorithm [see, Nikkei Electronics, Sept. 23, 1985 (No. 378), p. 234~280)].

However, even in such a Sort Engine, there are several disadvantages, such as the number of pieces of data to be processed is restricted; even when one piece of data is added through sorting to data block (total number N) which were sorted, $(N+1) \cdot \Delta T$ time is required ($\Delta T$: cycle time when sorting is carried out in a pipe line manner). Therefore, the usage of a Sort Engine is minimal.

SUMMARY OF THE INVENTION

The present invention, therefore, has as its principal object the provision of an improved memory device having a comparison function which can conduct a magnitude comparison between input data and stored data.

This and other objects are accomplished by a memory device with comparison function according to the present invention, which includes a plurality of unit cells connected in a matrix. Each unit cell includes a memory cell for holding data to be stored, said memory cell having a bit line and a word line, a sense line on which a comparison result appears, and a comparison circuit responsive to stored data outputted from the memory cell and input data supplied to the bit line for comparing the stored data and input data.

When the stored data is larger than the input data, the output of the sense line becomes a first logic level and, when the stored data is smaller than the input data, the output of the sense line becomes a second logic level which is different from the first logic level.

In a specific embodiment, the comparison circuit includes first and second switching circuits. The first switching circuit is disposed between the sense line and a first power supply terminal for comparing the stored data and input data, and the second switching circuit is disposed serially in said sense line for comparing the stored data and input data.

The memory cell may be a memory cell of a static random access memory, and have a pair of bit lines to which complimentary signals are supplied.

The first switching circuit may be composed of two field effect transistors which are series-connected; the gate of one field effect transistor is connected to the bit line and the gate of the other field effect transistor is connected to the output of the memory cell.

The second switching circuit may be composed of a NAND circuit and a field effect transistor; respectively two input terminals of said NAND circuit are connected to the output of the memory cell and to the bit line; the output of the NAND circuit is connected to the gate of said field effect transistor; and the field effect transistor is disposed in said sense line.

Furthermore, an amplifier may be inserted into the center of each row of unit cells for amplifying the signal to be propagated on the sense line.

The amplifier may be composed of a field effect transistor and a inverter which is connected to the gate of the field effect transistor.

According to the present invention as described herein, the following benefits, among others, are obtained.

(1) A memory device is provided which is capable of a high-speed comparison between input data and stored data according to the present invention.

(2) By use of LSI technology, it is possible to produce a memory device of large capacity and therefore, it is possible to provide LSI which is capable of instantaneously carring out magnitude comparisons of input data and stored data.

While the novel features of the invention are set forth with particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
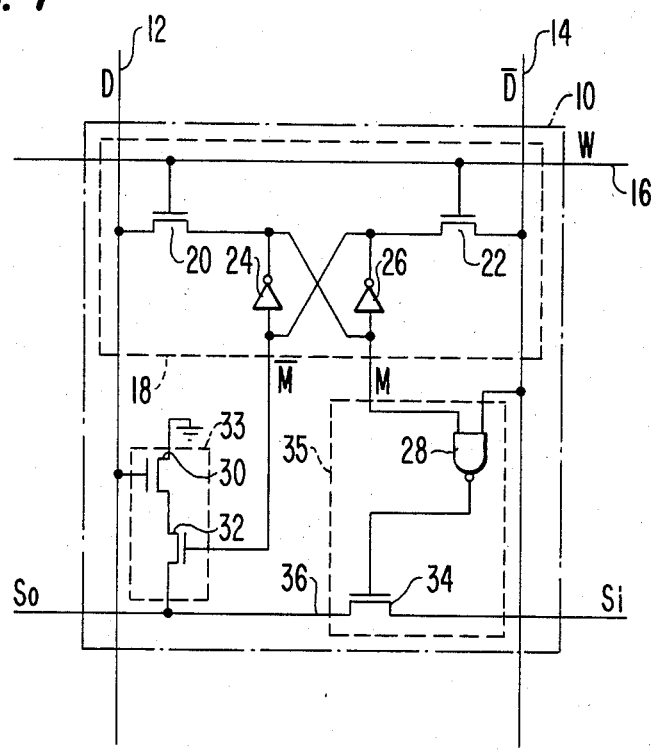
FIG. 1 is a circuit diagram of a unit cell of a memory device with a comparison function as one embodiment of the invention.

One embodiment of the invention is explained with reference to FIGS. 1 and 2. FIG. 1 shows a circuit diagram of a unit cell of a memory device with a comparison function. A unit cell of a memory device with a comparison function is designated by the numeral 10. Data to be stored in the cell 10 is supplied to the cell 10 through a pair of bit lines 12 and 14. Complimentary signals D and $\overline{D}$ appear on bit lines 12 and 14. A word line 16 is crossing over bit lines 12 and 14. Memory cell 18 of a static random access memory (SRAM) is disposed at the crossing portion of bit lines 12 and 14 and word line 16. Memory cell 10 produces stored data M and $\overline{M}$ at its output terminals. Word signal W appears on word line 16. Memory cell 18 includes two field effect transistors (FETs) 20 and 22 and two inverters 24 and 26.

Complimentary signals M and $\overline{M}$ appear on input lines of inverters 26 and 24. In addition to memory cell 18, the unit cell 10 includes a NAND circuit 28, three FETs 30, 32 and 34 and a sense line 36. Two input lines of the NAND circuit 28 are connected to the input line of the inverter 26 and the bit line 14, respectively. One output line of the NAND circuit 28 is connected to the gate electrode of the FET 34. The FET 34 is inserted into sense line 36. Both NAND circuit 28 and FET 34 form a second switching circuit 35. FETs 30 and 32 are connected in series with each other. The series connected circuit of FETs 30 and 32 form a first switching circuit 33 which is connected between ground and the sense line 36. The gate of the FET 30 is connected to the bit line 12 and the gate of the FET 32 is connected to the input line of the inverter 24. The sense line has its right-hand end designated as its input portion Si and has its left-hand portion designated as its output portion So.

Figure 2:
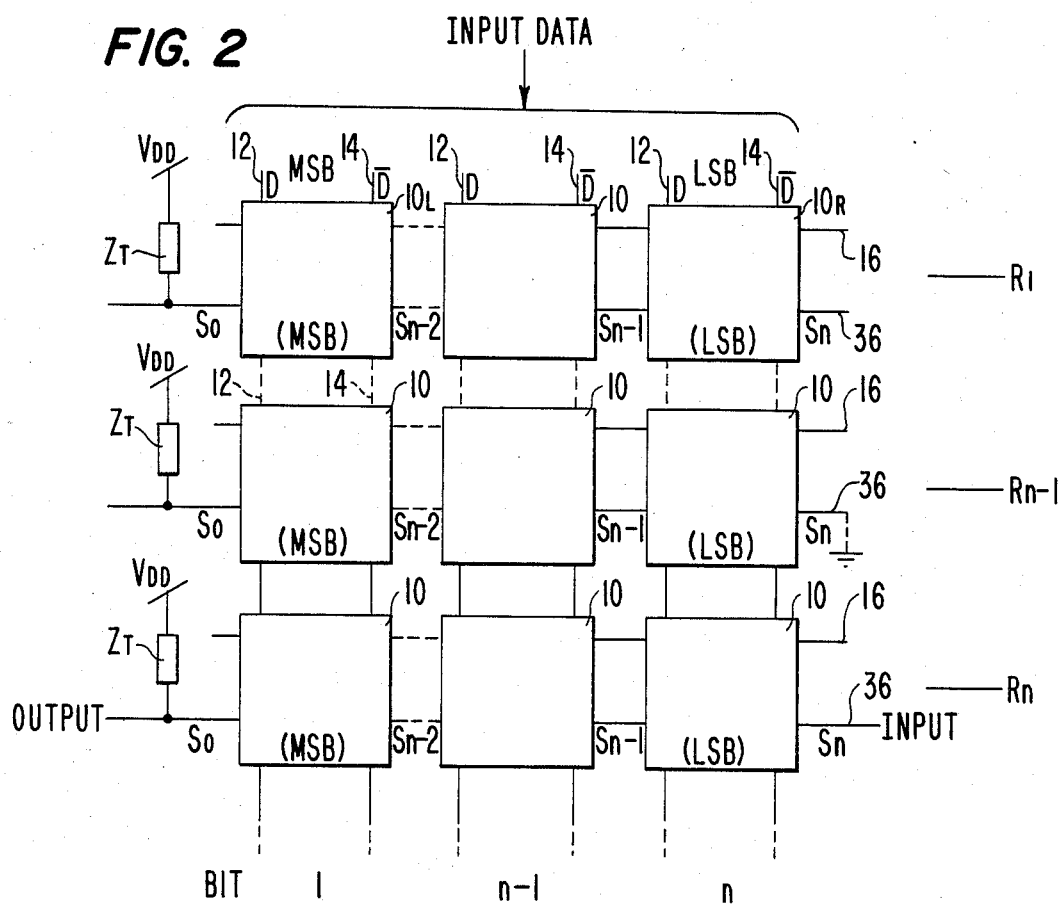
FIG. 2 is a block diagram of the memory device which is composed of a plurality of unit cells.

FIG. 2 shows a block diagram of the memory device with a comparison function. The memory device is composed of a plurality of unit cells 10 (one unit cell 10 is shown in FIG. 1). The unit cells are disposed in a matrix (row×column). One row of unit cells is disposed in the direction of word line 16 and adjacent sense lines 36 are connected to each other. That is, output portion So of a unit cell 10 is connected to input portion Si of an adjacent unit cell 10. Output portion So of each sense line 36 is connected to power supply terminal of $V_{DD}$ through a pull-up load element $Z_T$. One column of unit cells is disposed in the direction of the bit lines, and adjacent bit lines are connected to each other, as shown in FIG. 2.

Returning to FIG. 1 and D, $\overline{D}$ are input data and are complimentary voltages which are applied in case of a SRAM writing operation, etc. and M and $\overline{M}$ are stored data and are complimentary voltages. When a writing operation is carried out in unit cell 10, MOS FETs 20 and 22 of memory cell 18 are turned ON so that the electrical potential on bit line 12 (D) is written into memory cell 18 as M and the electrical potential on bit line 14 ($\overline{D}$) is written into memory cell 18 as $\overline{M}$.

Furthermore, as explained before, first and second switching circuits 33 and 35 are added to memory cell 18. The first switching circuit 33 is composed of FETs 30 and 32 which are connected in series with each other. The gates of FETs 30 and 32 are connected to D and $\overline{M}$, respectively. One end of the first switching circuit 33 is connected to a first power supply (in this case, Ground) and the other end thereof is connected to the output portion So of sense line 36. The other end may alternatively be connected to the input portion Si of sense line 36. The second switching circuit 35 is composed of NAND circuit 28 and FET 34. NAND circuit 28 receives M and $\overline{D}$ as its inputs and feeds its output to the gate of FET 34. FET 34 is disposed as a switch between input portion Si and output portion So of sense line 36.

Returning to FIG. 2, as explained before, a plurality of unit cells 10 are disposed in the word line direction and then, in the bit line direction. Speaking about one word block (one row of unit cells), input and output portions of sense lines of adjacent disposed unit cells are connected to each other. One end So of the sense line is connected to the second power supply (in this case, $V_{DD}$) through the load element $Z_T$. The other end Sn of the sense line 36 is kept open (non-connected) or connected to the first or second power supply. By use of this structure, it is possible to compare the stored data (M, $\overline{M}$) and the input data (D, $\overline{D}$).

The operation of the memory device is now explained. A plurality of unit cells 10 are grouped into a plurality of memory rows. $R_1 \sim R_n$. Each memory row is composed of a plurality of unit cells 10 which are connected in series, and stores data in such manner that the most left hand side unit cell $10_L$ stores the Most Significant Bit (MSB) of the stored data and the most right hand side unit cell $10_R$ stores the Least Significant Bit (LSB) of the stored data. As to the input data, the MSB of the input data is supplied to bit lines 12 and 14 of the most left hand side unit cell $10_L$ and the LSB of the input data is supplied to bit lines 12 and 14 of the most right hand side unit cell $10_R$. Then, at each unit cell 10, a comparison of input data D and $\overline{D}$ and stored data M and $\overline{M}$ is conducted to produce the comparison result at the output portion So of sense line 36.

First, the operation of one unit cell 10 is explained. There occur four cases according to the conditions of the input data D and $\overline{D}$ and the stored data M and $\overline{M}$. In this case, a high electrical potential is a "1" and a low electrical potential is a "0". FETs 30, 32, and 34 are turned ON when a "1" is supplied to their gates, and are turned OFF when a "0" is supplied to their gates. That is, these FETs are N channel FETs. This is because the switching characteristic of an N channel FET is generally better than that of a P channel FET. However, if the polarity of the power supply is reversed and a negative logic NAND circuit (i.e., a positive logic NOR circuit) is used as the NAND circuit 28, the same operation can be accomplished.

The above-stated four cases are as follows.

| Case | Condition |
|---|---|
| (1) | D = 0 ($\overline{D}$ = 1) and M = 0 ($\overline{M}$ = 1) |
| (2) | D = 1 ($\overline{D}$ = 0) and M = 1 ($\overline{M}$ = 0) |
| (3) | D = 0 ($\overline{D}$ = 1) and M = 1 ($\overline{M}$ = 1) |
| (4) | D = 1 ($\overline{D}$ = 0) and M = 0 ($\overline{M}$ = 1) |

As is apparent from the above table, in cases (1) and (2), the stored data coincides with the input data, and in cases (3) and (4), the stored data is different from the input data.

In these four cases, the condition of the first and second switching circuits 33 and 35 are as follows.

| Case | FET 30 | FET 32 | 1st S.C. 33 | NAND 28 | FET 34 | 2nd S.C. 35 |
|---|---|---|---|---|---|---|
| (1) | OFF | ON | OFF | 1 | ON | ON |
| (2) | ON | OFF | OFF | 1 | ON | ON |
| (3) | OFF | OFF | OFF | 0 | OFF | OFF |
| (4) | ON | ON | ON | 1 | ON | ON |

As is apparent from the above table, in cases (1) and (2), the FET 34 is turned ON so that the input portion Si of sense line 36 is connected to the output portion So of sense line 36.

In case (3), the FET 34 is turned OFF so that the input portion Si of sense line 36 is not connected to the output portion So of sense line 36.

In case (4), the first switching circuit 33 is turned ON so that the output portion So is connected to ground:

Therefore, the output So of unit cell 10 is as follows according to cases (1)~(4).

| Case | So |
|------|-----|
| (1) | = Si, i.e., dependent upon the condition of |
| (2) | Si (if Si = 0, So = 0, if Si = 1, So = 1) |
| (3) | 1 (High level) |
| (4) | 0 (Low level) |

Now, the operation of memory row R which is composed of n unit cells is explained. One word is composed of n bits and these bits are designated as 1, 2, . . . n from the MSB. That is, bit n is the LSB. Each bit of stored data $\tilde{M}$ (=M, $\overline{M}$) is designated as Mi (i=1~n), and each bit of input data $\tilde{D}$ (=D, $\overline{D}$) is designated as Di (i=1~n).

Under such a situation, (i) in case of $\tilde{M} = \tilde{D} \rightarrow Mi = Di$ (i = 1 ~ n)

(ii) in case of $\tilde{M} > \tilde{D}$ $$\rightarrow \begin{cases} Mi = Di & [i = 1 \sim (P - 1)] \\ Mp = 1 & P = 1 \sim n \\ Dp = 0 \end{cases}$$

(iii) in case of $\tilde{M} < \tilde{D}$ $$\rightarrow \begin{cases} Mi = Di & [i = 1 \sim (Q - 1)] \\ M_Q = 0 & Q = 1 \sim n \\ D_Q = 1 \end{cases}$$

The operation of the FIG. 2 memory device is now explained in the above three cases (i)~(iii).

In case (i), i.e., $\tilde{M}=\tilde{D}$, the first switching circuits 33 of all of the cells 10 are turned OFF and the second switching circuits 35 are turned ON so that the output portion So of sense line 36 is connected to the input portion Si of sense line 36, and the output signal at output portion So appears according to the electrical potential of the input portion (in FIG. 2, Sn). In this case, if Sn is open, So becomes $V_{DD}$ (i.e., "1") by the operation of the load element $Z_T$. If the FETs 30, 32 and 34 are n (p) channel FETs, Sn is kept open or connected to ground ($V_{DD}$).

In case (ii), i.e., $\tilde{M}>\tilde{D}$, at the bits from the MSB to (P−1), the FET 34 is ON, and the first switching circuit 33 is OFF and at the bit P, that FET 34 is turned OFF and the first switching circuit 33 is OFF. Therefore, the output So becomes a "1".

In case (iii), i.e., $\tilde{M}<\tilde{D}$, at the bits from the MSB to (Q−1), the FET 34 is ON and the first switching circuit 33 is OFF and at the bit Q, the FET 34 is ON and the first switching circuit 33 is turned ON. Therefore, unless Sn is a "1", the output So becomes a "0".

The foregoing is summarized as follows.

| $\tilde{M}, \tilde{D}$ | Sn | So |
|------|-----|------|
| $\tilde{M} > \tilde{D}$ | — | 1 |
| $\tilde{M} = \tilde{D}$ | Open | 1 |
|  | 0 | 0 |
| $\tilde{M} < \tilde{D}$ | — | 0 |

In the FIG. 1 structure, if D and $\overline{D}$ and M and $\overline{M}$ are reversed, it is possible to obtain reversed outputs of $\tilde{M}<\tilde{D}\rightarrow So=0$, $\tilde{M}<\tilde{D}\rightarrow So=1$. As is apparent from the above explanation, it is possible to conduct magnitude comparison of two pieces of data M and $\tilde{D}$.

If the comparison is actually carried out, a problem may occur in having a long propagation time of a signal on sense line 36 if the bit length of one word is long. This is because the floating capacitance of sense line 36 becomes large in the above case, and it takes more time for charging and discharging the capacitor. Since the ON resistance of the FET 34 is not zero, an RC circuit is formed by the floating capacitance and ON resistance of the FET 34 and the output voltage varies according to time constant of the RC circuit.

In any event, if the bit length of one word becomes large, the output response becomes slower commensurate to the bit length or second power of the bit length. Therefore, in order to obtain a high-speed operation, as shown in the FIG. 3 (in case of a six (6) bit word length), the original $S_3$ node is divided into two nodes $S_3'$ and $S_3''$ and an FET 38 and inverter 40 are disposed between nodes $S_3'$ and $S_3''$. An additional load $Z_T$ is connected to node $S_3''$ as shown in FIG. 3.

Figure 3:
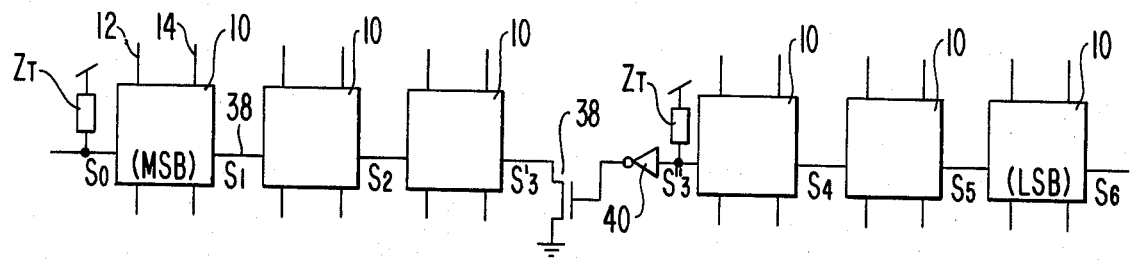
FIG. 3 is a block diagram of the memory device which is capable of a high speed operation.

By use of the FIG. 3 structure, a signal coming from the LSB side (right hand side in FIG. 3) is amplified by FET 38 and thereafter, supplied to the MSB side so that total delay time is considerably reduced.

Figure 4:
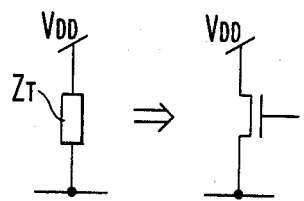
FIG. 4 is a drawing of a dynamic load which is suitable for use as a load element.
Figure 5:
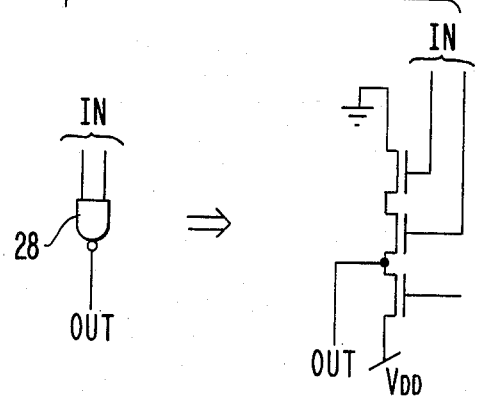
FIG. 5 is a drawing of a dynamic NAND circuit which is suitable for use as the NAND circuit.

FIG. 4 shows a load $Z_T$ which is formed by an FET and FIG. 5 shows a NAND circuit 28 which is formed by three FETs which are connected in series.

Figure 6:
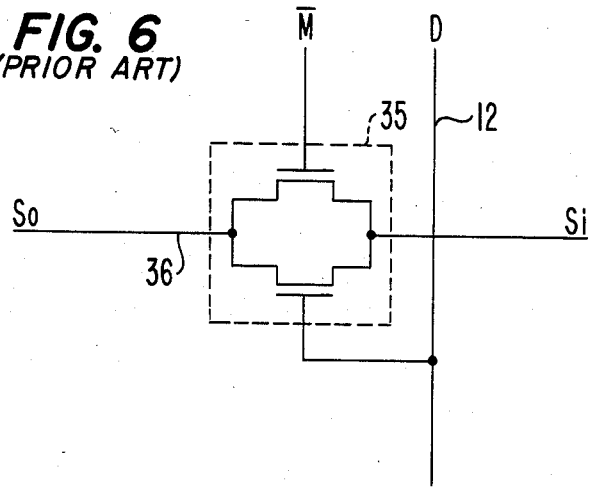
FIG. 6 is a drawing of a switching element which is composed of two FETs instead of a NAND circuit and a FET.

Furthermore, if data to be compared is supplied to bit lines 12 and 14 and the polarity of the data can be reversed, then the second switching circuit 35 (in FIG. 1, which is formed by NAND circuit 28 and FET 34) can be replaced by the FIG. 6 circuit in which the second switching circuit 35 is formed by the parallel connection of two FETs.

Figure 7:
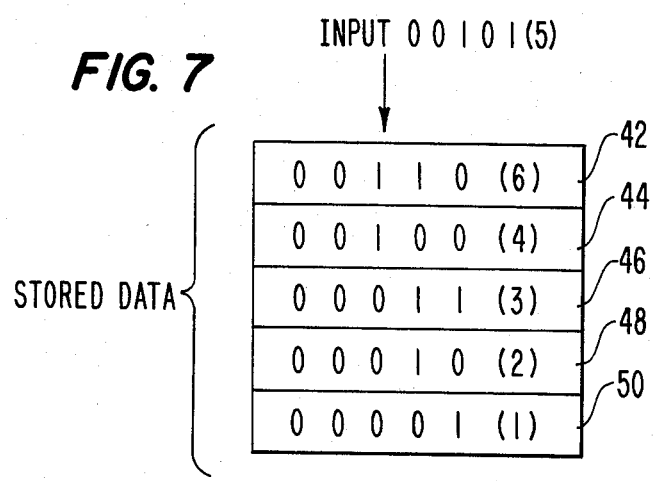
FIGS. 7 and 8 are illustrations for use in explaining the operation of the memory device.

The operation of the memory device is further explained by use of one concrete example. As shown in FIG. 7, there supposed to be five (5) kinds of stored data, i.e., 00110 as binary coded number (6 as decimal number), 00100(4), 00011(3), 00010(2), 00001(1) in five memory rows 42, 44, 46, 48, 50. One memory row, one i.e., row of unit cells, includes five unit cells 10 which are serially connected. Under such circumstances, data of 00101(5) is supplied to the memory device and sorting is conducted. As a result of sorting, the input data must be disposed between 6 and 4. To accomplish this result, the followings must be determined.

That is, (i) Input data (5) is smaller than largest stored data (6).

(ii) Input data (5) is larger than second largest stored data (4).

(iii) Remaining stored data (3), (2), (1) are all smaller than the input data (5).

Figure 8:
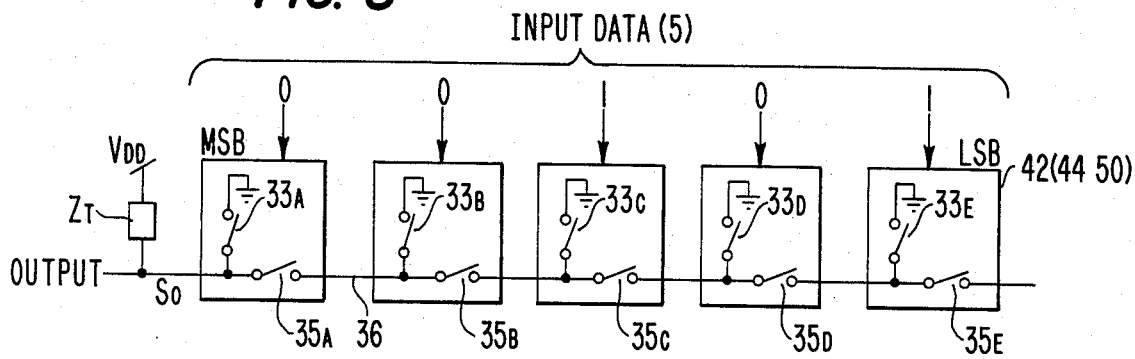

As to the way of determining such matter, it is explained with reference to FIG. 8 and the table described below. FIG. 8 shows a structure of one memory row and the following table shows the condition of switching circuit in comparison operation.

| Memory | 33A | 33B | 33C | 33D | 33E | 35A | 35B | 35C | 35D | 35E | Output |
|---|---|---|---|---|---|---|---|---|---|---|---|
| 42 | OFF | OFF | OFF | OFF | ON | ON | ON | ON | OFF | ON | High |
| 44 | OFF | OFF | OFF | OFF | ON | ON | ON | ON | ON | ON | Low |
| 46 | OFF | OFF | ON | OFF | OFF | ON | ON | ON | OFF | ON | Low |
| 48 | OFF | OFF | ON | OFF | ON | ON | ON | ON | OFF | ON | Low |
| 50 | OFF | OFF | ON | OFF | OFF | ON | ON | ON | ON | ON | Low |

As is apparent from the table, only the output of memory row 42 is high and the others are all low. The comparison of input data (5) and each of stored data (6), (4)~(1) is conducted simultaneously and it is determined that the input data is larger than stored data (4) and smaller than stored data (6) so that the input data is sorted between stored data 6 and 4.

While specific embodiments of the invention have been illustrated and described herein, it is realized that other modification and changes will occur to those skilled in the art. It is therefore to be understood that the appended claims are intended to cover all modifications and changes as fall within the true spirit and scope of the invention.

What I claim is:

1. A memory device with a comparison function comprising:
   a plurality of unit cells connected in a matrix of rows and columns such that each row forms a memory word; each unit cell including:
   (a) a memory cell for holding data to be stored, said memory cell coupled to a bit line and a word line;
   (b) a sense input node connected to a sense output node of a less significant neighboring memory cell in the word;
   (c) a sense output node connected to a sense input node of a more significant neighboring memory cell in the word;
   (d) a first switching circuit disposed between one of said sense nodes and a first power supply terminal, and having two control inputs which receive the logical complement of the stored data in said memory cell and input data on said bit line, respectively, wherein said first switching circuit is conductive only when both control inputs are at a logical "1" level;
   (e) a second switching circuit disposed between said sense output node and said sense input node, and having two control inputs which receive the stored data in said memory cell and the logical complement of the input data on said bit line, respectively, wherein said second switching circuit is non-conductive only when both control inputs are at a logical "1" level;
   load elements respectively disposed between a second power supply terminal and the sense output node of the most significant MSB memory cell in each word;
   whereby, results of the comparison can be detected by the voltages across said load elements.

2. The memory device of claim 1, wherein in each unit cell, said memory cell is a memory cell of static random access memory.

3. The memory device of claim 1, wherein in each unit cell, said memory cell is coupled to a pair of bit lines to which complimentary signals are applied.

4. The memory device of claim 1, wherein in each unit cell, said first switching circuit is composed of two field effect transistors which are series-connected and the gate of one field effect transistor is connected to the bit line and the gate of the other field effect transistor is connected to the output of the memory cell.

5. The memory device of claim 1, wherein each of said load elements is composed of a field effect transistor.

6. The memory device of claim 1, wherein in each unit cell, said second switching circuit is composed of a parallel connection of two field effect transistors and the gate of one field effect transistor is connected to the output of the memory cell and the gate of the other field effect transistor is connected to the bit line.

7. The memory device of claim 1, wherein said first power supply terminal is ground.

8. The memory device of claim 1, wherein said second power supply terminal is a positive power supply terminal.

9. The memory device of claim 1, wherein in each unit cell, said second switching circuit is composed of a NAND circuit and a field effect transistor, and two input terminals of said NAND circuit are connected to the output of the memory cell, the bit line, respectively, and the output of the NAND circuit is connected to the gate of said field effect transistor, and the field effect transistor is disposed in said sence line.

10. The memory device of claim 9, wherein in each unit cell, said NAND circuit is composed of three field effect transistors connected is series.

11. The memory device of claim 1, wherein an amplifier is inserted into approximately the center of each row of unit cells for amplifying the signal to be propagated on said sense line.

12. The memory device of claim 11, wherein said amplifier is composed of a field effect transistor and an inverter, the output of which which is connected to the gate of the field effect transistor.

13. A memory device with a comparison function comprising:
   a plurality of unit cells connected in matrix of rows and columns such that each row forms a memory word; each unit cell including:
   (a) a memory cell for holding data to be stored, said memory cell having a bit line and a word line;
   (b) a sense input node wherein a sense output of an LSB neighboring memory cell on the word is connected;
   (c) a sense output node connected to a sense input node of an MSB neighboring memory cell on the word;
   (d) a first switching circuit with two control inputs, which is disposed between said sense input node or output node and a first power supply terminal, whose control inputs receive the logical complement of the stored data in said memory cell and input data on said bit line, respectively, wherein said first switching circuit is conductive only when both control inputs are at a logical "1" level;

(e) a second switching circuit with two control inputs, which is disposed between said sense output node and said sense input node, whose control inputs receive the stored data in said memory cell and logical complement of the input data on said bit line, respectively, wherein said second switching circuit is non-conductive only when both control inputs are at a logical "1" level;

load elements disposed between a second power supply and said sense output nodes of MSB memory cells in each word;

whereby, results of the comparison can be detected by the voltages across said load elements;

wherein said memory cells each comprise static random access memory cells;

and wherein said second switching circuit is composed of a NAND circuit and a field effect transistor whose current path is connected between said sense input node and said sense output node, wherein two input terminals of said NAND circuit are connected to an output of the memory cell and said bit line, respectively, and an output of the NAND circuit is connected to a gate of said field effect transistor.

* * * * *